United States Patent
Kawai et al.

(10) Patent No.: US 9,379,000 B2
(45) Date of Patent: Jun. 28, 2016

(54) METHOD FOR PRODUCING NANOCARBON FILM AND NANOCARBON FILM

(71) Applicant: Shin-Etsu Chemical Co., Ltd., Tokyo (JP)

(72) Inventors: Makoto Kawai, Annaka (JP); Yoshihiro Kubota, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/435,235

(22) PCT Filed: Aug. 7, 2013

(86) PCT No.: PCT/JP2013/071333
§ 371 (c)(1),
(2) Date: Apr. 13, 2015

(87) PCT Pub. No.: WO2014/061337
PCT Pub. Date: Apr. 24, 2014

(65) Prior Publication Data
US 2015/0262862 A1    Sep. 17, 2015

(30) Foreign Application Priority Data
Oct. 15, 2012   (JP) .................... 2012-227851

(51) Int. Cl.
*H01L 21/762* (2006.01)
*C01B 31/02* (2006.01)
(Continued)

(52) U.S. Cl.
CPC ........ *H01L 21/76254* (2013.01); *B82Y 30/00* (2013.01); *B82Y 40/00* (2013.01);
(Continued)

(58) Field of Classification Search
CPC . H01L 21/76254; H01L 21/324; C01B 31/02; C01B 31/0206; C30B 29/36; C30B 29/02; C30B 31/22; B82Y 40/00; B82Y 30/00
See application file for complete search history.

(56) References Cited

U.S. PATENT DOCUMENTS

| 8,039,361 B2 * | 10/2011 | Murphy | ............ H01L 21/76254 257/E21.122 |
| 2009/0218549 A1 | 9/2009 | Kato et al. | |

FOREIGN PATENT DOCUMENTS

| JP | 2004-196631 A | 7/2004 |
| JP | 2007-335532 A | 12/2007 |
| JP | 2009-91174 A | 4/2009 |
| JP | 2009-200177 A | 9/2009 |
| JP | 2012-31011 A | 2/2012 |

OTHER PUBLICATIONS

International Search Report dated Nov. 12, 2013, issued in corresponding application No. PCT/JP2013/071333.
(Continued)

*Primary Examiner* — David Vu
(74) *Attorney, Agent, or Firm* — Westerman, Hattori, Daniels & Adrian, LLP

(57) ABSTRACT

The present invention relates to a method for producing a nanocarbon film using a hybrid substrate with which a nanocarbon film free from defects can be produced at low cost. This method is characterized in forming an ion implantation region by implanting ion into a single crystal silicon carbide substrate from a surface thereof and after bonding together the surface of the silicon carbide substrate implanted with ion and a surface of a base substrate, releasing the silicon carbide substrate at the ion implanted region to produce a hybrid substrate in which a thin film that includes the single crystal silicon carbide is transferred onto the base substrate, and then heating the hybrid substrate to sublime silicon atoms from the thin film that includes the single crystal silicon carbide so as to obtain the nanocarbon film.

13 Claims, 1 Drawing Sheet

(51) Int. Cl.
  *B82Y 30/00* (2011.01)
  *B82Y 40/00* (2011.01)
  *C30B 29/02* (2006.01)
  *C30B 29/36* (2006.01)
  *C30B 31/22* (2006.01)
  *C30B 33/06* (2006.01)
  *H01L 21/02* (2006.01)
  *H01L 21/324* (2006.01)

(52) U.S. Cl.
  CPC ............ *C01B 31/02* (2013.01); *C01B 31/0206* (2013.01); *C30B 29/02* (2013.01); *C30B 29/36* (2013.01); *C30B 31/22* (2013.01); *C30B 33/06* (2013.01); *H01L 21/02043* (2013.01); *H01L 21/324* (2013.01)

(56) References Cited

OTHER PUBLICATIONS

McArdle, Timothy et al., "Multilayer epitaxial graphene formed by pyrolysis of polycrystalline silicon-carbide grown on c-plane sapphire substrates", Applied Physics Letters, American Institute of Physics, vol. 98, No. 13, Apr. 2011, pp. 132108-1 thru 132108-3.

Rohrl, J. et al., "Strain and charge in epitaxial graphene on silicon carbide studied by raman spectroscopy", Material Science Forum, Trans Tech Publications Ltd—Switzerland, CH, vol. 645-648, Jan. 2010, pp. 603-606.

Extended (Supplementary) European Search Report dated Apr. 18, 2016, issued in counterpart European Patent Application No. 13847732.8 (9 pages).

* cited by examiner

BONDING AFTER SURFACE ACTIVATION TREATMENT

RELEASING

SILICON CARBIDE THIN FILM POLISHING

SILICON ATOM SUBLIMATION

METHOD FOR PRODUCING NANOCARBON FILM AND NANOCARBON FILM

TECHNICAL FIELD

This invention relates to a method for producing a nanocarbon film, more particularly to a method for producing a nanocarbon film of quality at low cost, and a nanocarbon film produced by the method.

BACKGROUND ART

Among solid carbon materials, nanocarbon materials in which all atomic positions can be located have recently drawn great attention since they were discovered to have characteristics including specifically high electron mobility at room temperature, very low electric resistance at room temperature, and high thermal conductivity.

The nanocarbon materials are divided in terms of their structure into fullerene, carbon nanotubes, and graphene. With respect to graphene, for example, a method for producing graphene by effecting high-temperature heat treatment on a silicon carbide (SiC) substrate in vacuum, for letting silicon atoms sublime from the surface of the silicon carbide substrate, whereby the remaining carbon atoms form graphene on the surface of the silicon carbide substrate was proposed (JP-A 2007-335532 (Patent Document 1)).

This method, however, has such problems as the necessity of heat treatment of very expensive silicon carbide substrates at extremely high temperature, and difficult working of silicon carbide substrates. For mass scale production, a number of expensive silicon carbide substrates must be furnished. From both the aspects of production process and price, the method is quite difficult to implement.

Also, a method of producing graphene by heat treating a silicon carbide substrate to form a graphene film, bonding the silicon carbide substrate to a support substrate (other than silicon carbide substrate) such as silicon substrate or quartz substrate, followed by separation was proposed (JP-A 2009-200177 (Patent Document 2)).

This method, however, has such problems as extreme difficulty to separate the graphene film having an atomic layer thickness from the silicon carbide substrate and very low production yields.

To solve the outstanding problems, a method of producing graphene by growing a silicon carbide layer on a silicon substrate or silicon film, and laser heating the layer to convert its surface into a graphene film was proposed (JP-A 2012-31011 (Patent Document 3)).

However, when silicon carbide is grown on a silicon substrate or silicon film, the resulting silicon carbide film contains many defects since strains are induced in the crystal structure. This gives rise to the problem that the graphene film also contains many defects.

Also, a method of producing a graphene film by epitaxially growing a silicon carbide layer and letting silicon atoms sublime is proposed, but has the drawback of many defects.

On the other hand, a method of simply forming a graphene sheet utilizing a metal catalyst such as nickel is proposed (JP-A 2009-91174 (Patent Document 4)).

On use of the metal catalyst, however, a catalyst metal layer having high electrical conductivity is left behind, which inhibits to design a functional electronic device using the graphene film alone.

SUMMARY OF INVENTION

Technical Problem

An object of the invention, which has been made under the above-mentioned circumstances, is to provide a method for producing a nanocarbon film using a hybrid substrate, the method enabling to produce a defect-free nanocarbon film at low cost, and a nanocarbon film produced by the method.

Solution to Problem

To attain the above object, the invention provides a method for producing a nanocarbon film and a nanocarbon film, as defined below.

[1] A method for producing a nanocarbon film using a hybrid substrate, comprising the steps of implanting ions into a surface of a single crystal silicon carbide substrate to form an ion-implanted region, bonding the ion-implanted surface of the silicon carbide substrate to a surface of a base substrate, separating the silicon carbide substrate at the ion-implanted region, thus leaving a hybrid substrate having a single crystal silicon carbide-containing thin film transferred onto the base substrate, and then heating the hybrid substrate so that silicon atoms may sublime from the single crystal silicon carbide-containing thin film, yielding a nanocarbon film.

[2] The method for producing a nanocarbon film of [1] wherein said base substrate comprises single crystal silicon, sapphire, polycrystalline silicon, alumina, silicon nitride, aluminum nitride or diamond.

[3] The method for producing a nanocarbon film of [1] or [2] wherein a film is formed on at least the surface of the silicon carbide substrate and/or the base substrate to be bonded, the film comprising at least one component selected from the group consisting of silicon oxide, single crystal silicon, polycrystalline silicon, amorphous silicon, alumina, silicon nitride, silicon carbide, aluminum nitride, and diamond.

[4] The method for producing a nanocarbon film of any one of [1] to [3] wherein the silicon carbide substrate has a crystal structure of 4H-SiC, 6H-SiC or 3C-SiC.

[5] The method for producing a nanocarbon film of any one of [1] to [4] wherein the step of forming an ion-implanted region includes implanting ions containing at least hydrogen ions into a surface of the silicon carbide substrate.

[6] The method for producing a nanocarbon film of any one of [1] to [5] wherein the surface of the silicon carbide substrate and/or the base substrate to be bonded is subjected to at least one surface activation treatment selected from the group consisting of ion beam treatment, plasma activation treatment, ozone treatment, acid washing treatment and alkali washing treatment, prior to the bonding step.

[7] The method for producing a nanocarbon film of any one of [1] to [6] wherein after the step of bonding the silicon carbide substrate to the base substrate, the step of separating the silicon carbide substrate at the ion-implanted region includes providing thermal energy, mechanical energy or light energy to the ion-implanted region.

[8] The method for producing a nanocarbon film of any one of [1] to [7] wherein the step of bonding the silicon carbide substrate to the base substrate includes heat treatment at 150° C. or higher.

[9] The method for producing a nanocarbon film of any one of [1] to [8] wherein the hybrid substrate is heated at 1,100° C. or higher for sublimation of silicon atoms.

[10] The method for producing a nanocarbon film of any one of [1] to [9] wherein the hybrid substrate is heated in vacuum for sublimation of silicon atoms.

[11] The method for producing a nanocarbon film of any one of [1] to [10] wherein the nanocarbon film comprises carbon nanotubes, graphene or fullerene.

[12] The method for producing a nanocarbon film of any one of [1] to [11] wherein after the separation step, the silicon carbide substrate is used again for the production of nanocarbon film.

[13] A nanocarbon film produced by the method of any one of [1] to [12].

Advantageous Effects of Invention

According to the invention, a single crystal silicon carbide film is thin-film transferred to a base substrate. This eliminates a need to furnish a number of expensive silicon carbide substrates, and enables to produce a nanocarbon film at low cost. Since the silicon carbide film is separated as thin film by the ion implantation/separation process, a nanocarbon film in thin-film form is readily obtainable. Since a nanocarbon film is produced from a single crystal silicon carbide film of quality through sublimation of silicon atoms, a substantially defect-free nanocarbon film of quality is obtainable.

DESCRIPTION OF EMBODIMENTS

Below the method for producing a nanocarbon film according to the invention is described.

Figure 1A:
FIG. 1 is a schematic view showing steps of the method for producing a nanocarbon film according to one embodiment of the invention; (a) being a cross-sectional view of an ion-implanted silicon carbide substrate; (b) being a cross-sectional view of a base substrate; (c) being a cross-sectional view of a bonded structure of silicon carbide substrate/base substrate; (d) being a cross-sectional view of the structure from which the silicon carbide substrate is separated along the ion-implanted region; (e) being a cross-sectional view of a hybrid substrate; (f) being a cross-sectional view of a nanocarbon film formed thereon.
Figure 1B:
Figure 1C:
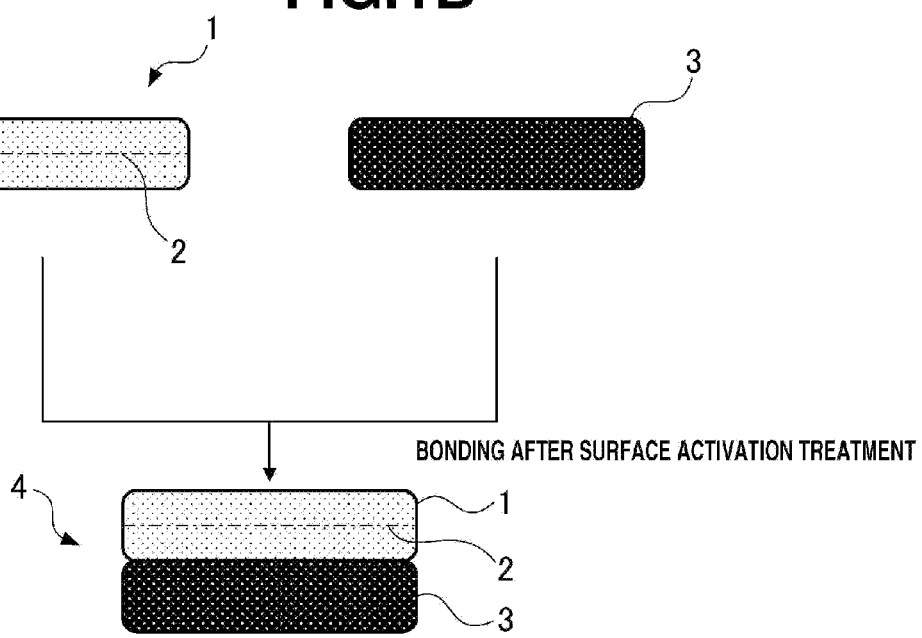
Figure 1D:
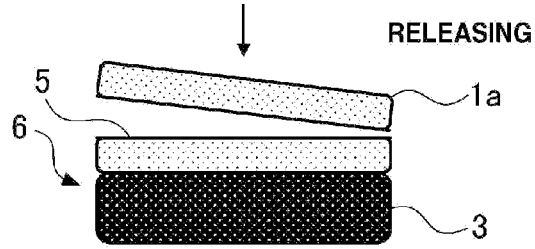
Figure 1E:
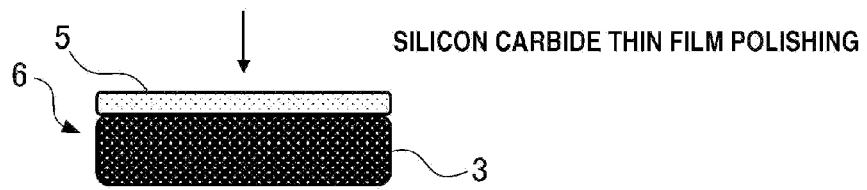
Figure 1F:
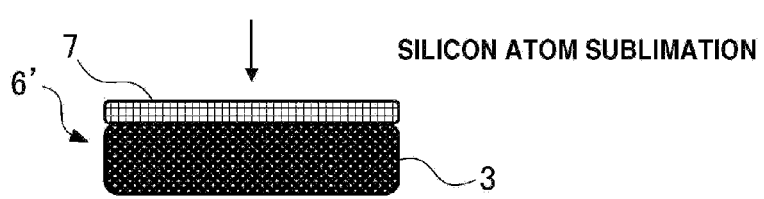

The method for producing a nanocarbon film according to the invention involves, as shown in FIG. 1, the following successive steps: step 1 of implanting hydrogen ions into a silicon carbide substrate, step 2 of furnishing a base substrate, step 3 of surface activating the silicon carbide substrate and/or base substrate, step 4 of bonding the silicon carbide substrate to the base substrate, step 5 of separation, step 6 of polishing a silicon carbide thin film, and step 7 of silicon atom sublimation.

(Step 1 of Implanting Hydrogen Ions into Silicon Carbide Substrate)

First, ions, typically hydrogen ions are implanted into a single crystal silicon carbide substrate 1 to form an ion-implanted region 2 (FIG. 1 (a)).

The single crystal silicon carbide substrate 1 to be bonded to a base substrate 3 is preferably selected from those substrates having a crystal structure of 4H-SiC, 6H-SiC and 3C-SiC. The size of silicon carbide substrate 1 and base substrate 3 to be described later is determined from the size and cost of a desired nanocarbon film and other factors. From the aspect of handling, the thickness of silicon carbide substrate 1 is preferably approximate to the substrate thickness according to SEMI or JEIDA standards.

In implanting ions into the silicon carbide substrate 1, at least hydrogen ions ($H^+$) or hydrogen molecule ions ($H_2^+$) are implanted in a predetermined dose with a sufficient implantation energy to form the ion-implanted region 2 at the desired depth from the substrate surface. Among conditions, the ion implantation energy may be selected so as to reach a desired thin-film thickness. He, B or other ions may be simultaneously implanted, and ions of any species may be employed as long as an equivalent effect is obtained.

The depth of ion implantation is typically 100 to 2,000 nm, though it varies depending on the desired thin-film thickness.

The dose of hydrogen ions ($H^+$) implanted into the silicon carbide substrate 1 is preferably $1.0 \times 10^{16}$ to $9.0 \times 10^{17}$ atoms/$cm^2$. If the dose is less than $1.0 \times 10^{16}$ atoms/$cm^2$, interface embrittlement may not occur. If the dose exceeds $9.0 \times 10^{17}$ atoms/$cm^2$, bubbles form during heat treatment following the bonding step, leading to transfer failure.

Where hydrogen molecule ions ($H_2^+$) are used for implantation, the dose is preferably $5.0 \times 10^{15}$ to $4.5 \times 10^{17}$ atoms/$cm^2$. If the dose is less than $5.0 \times 10^{15}$ atoms/$cm^2$, interface embrittlement may not occur. If the dose exceeds $4.5 \times 10^{17}$ atoms/$cm^2$, bubbles form during heat treatment following the bonding step, leading to transfer failure.

If an insulating film such as silicon oxide film of about 50 to 500 nm thick is previously formed on the surface of silicon carbide substrate 1, and hydrogen or hydrogen molecule ions are implanted therethrough, then an effect of suppressing channeling of implanting ions is obtainable.

It is also acceptable that a film similar to the film deposited on the base substrate 3 as will be described later is formed on the surface of silicon carbide substrate 1.

(Step 2 of Furnishing Base Substrate (FIG. 1 (b)))

The base substrate 3 used herein may be made of a material selected from among single crystal silicon, sapphire, polycrystalline silicon, alumina, silicon nitride, aluminum nitride, and diamond. Although the thickness of base substrate 3 is not particularly limited, like the silicon carbide substrate 1, a base substrate approximate to the customary thickness according to SEMI or JEIDA standards is easy to handle.

Preferably a film of at least one component selected from among silicon oxide, single crystal silicon, polycrystalline silicon, amorphous silicon, alumina, silicon nitride, silicon carbide, aluminum nitride, and diamond is formed on at least the surface of base substrate 3 to be bonded, by a technique selected from oxidative treatment, chemical vapor deposition (CVD), epitaxial treatment, and sputtering. This film facilitates bonding between the base substrate 3 and the silicon carbide substrate 1. The thickness of the film is desirably set to a sufficient value to prevent exfoliation during heat treatment to be described later. The film forming technique may be selected depending on the properties, cost and purity of the film.

(Step 3 of Surface Activation of Silicon Carbide Substrate and/or Base Substrate)

Next, the surfaces of silicon carbide substrate 1 and base substrate 3 to be bonded are subjected to at least one surface activation treatment selected from among ion beam treatment, plasma activation treatment, ozone treatment, acid washing treatment and alkali washing treatment.

Of these treatments, ion beam treatment is by placing the silicon carbide substrate 1 and/or base substrate 3 in a high vacuum chamber, and irradiating an ion beam of Ar or the like to the surface to be bonded, for activation treatment.

In the case of plasma activation treatment, the silicon carbide substrate 1 and/or base substrate 3 is placed in a vacuum chamber, a plasma-creating gas is introduced therein under reduced pressure, and the substrate is exposed to a highfrequency plasma of about 100 W for about 5 to 10 seconds, whereby the surface is plasma activation treated. The plasma-creating gas may be oxygen gas, hydrogen gas, nitrogen gas, argon gas, a mixture thereof, or a mixture of hydrogen gas and helium gas.

In the case of ozone treatment, the silicon carbide substrate 1 and/or base substrate 3 is cleaned as by RCA cleaning, placed in an air-fed chamber, and a UV lamp is operated to emit radiation to convert oxygen in air to ozone, with which the substrate surface is treated.

In the case of acid washing treatment and alkali washing treatment, the silicon carbide substrate 1 and/or base substrate 3 is immersed in a mixture of aqueous ammonia and hydrogen peroxide or a mixture of hydrochloric acid and hydrogen peroxide, with which the substrate surface is etched for activation treatment.

The surface activation treatment mentioned above may be carried out on the silicon carbide substrate 1 alone or the base substrate 3 alone, but preferably on both the silicon carbide substrate 1 and the base substrate 3.

Also, the surface activation treatment may be any one of the above-mentioned treatments or a combination of such treatments.

Further, the surface of silicon carbide substrate 1 and base substrate 3 subject to surface activation treatment is preferably the surface to be bonded.

(Step 4 of Bonding Silicon Carbide Substrate and Base Substrate Together)

Next, the silicon carbide substrate 1 is bonded to the base substrate 3, with their surfaces subjected to surface activation treatment being mated together, to form a bonded substrate 4 (FIG. 1 (c)).

After the silicon carbide substrate 1 is bonded to the base substrate 3, the bonded substrate is preferably heat treated at a temperature of 150 to 350° C., more preferably 150 to 250° C., to improve the bond strength of the mated interface. At this point, the silicon carbide substrate 1 and the base substrate 3 can warp due to a difference of coefficient of thermal expansion therebetween. It is thus recommended to select an appropriate temperature for the respective materials to suppress warpage. The heat treatment time is preferably 2 to 24 hours although it depends more or less on the temperature.

(Step 5 of Separating Treatment)

Once the silicon carbide substrate 1 is bonded to the base substrate 3 and treated to improve the bond strength, thermal energy, mechanical energy or light energy is applied to the ion-implanted region 2 to cause separation along the ion-implanted region 2, leaving a hybrid substrate 6 having a silicon carbide thin film 5 on the base substrate 3 (FIG. 1 (d)).

The separating treatment may be carried out by any suitable method, for example, a separation method of heating at a temperature of preferably 350° C. or higher, more preferably 400 to 600° C. to apply thermal energy to the ion-implanted region to generate micro-bubbles in the region; a separation method wherein mechanical energy such as an impact force obtained by injecting a jet of fluid such as gas or liquid is applied to the ion-implanted region which has been embrittled by the heat treatment, while selecting a pressure which is insufficient to cause wafer breakage and, for example, in a range of 1 MPa to 5 MPa; and a separation method of irradiating light to the ion-implanted region, letting the region absorb light energy to cause separation at the ion-implanted interface; or a combination thereof.

After the silicon carbide substrate 1a is separated, its surface is polished, cleaned or otherwise processed again whereupon it may be reused as a bonding substrate in the relevant method for producing a nanocarbon film.

(Step 6 of Polishing Silicon Carbide Thin Film)

The silicon carbide thin film 5 on the base substrate 3 is mirror finished at its surface (FIG. 1 (e)). Specifically, the silicon carbide thin film 5 is subjected to chemical-mechanical polishing (CMP) to mirror finish. Polishing may be any prior art well-known CMP used for the planarization of silicon wafers.

(Step 7 of Silicon Atom Sublimation)

The hybrid substrate 6 is heated at a temperature of preferably at least 1,100° C., more preferably 1,200 to 1,400° C., and even more preferably 1,250 to 1,350° C., for letting silicon (Si) atoms sublime from the silicon carbide thin film 5, yielding a nanocarbon film 7 having a thickness of about 50 to 1,500 nm (FIG. 1 (f)). The atmosphere for this heat treatment is preferably a vacuum (or reduced pressure) atmosphere, which facilitates silicon atom sublimation. Since the temperature condition varies with the atmosphere, the number of substrates to be treated and other factors, an optimum temperature is set as the case may be.

The nanocarbon film 7 at the end of sublimation may be fullerene, graphene or carbon nanotubes, depending on the producing conditions or the like. A choice may be made in accordance with a particular application.

EXAMPLES

Examples and Comparative Examples are given below for illustrating the invention, but the invention is not limited thereto.

Example 1

As the single crystal silicon carbide substrate, a 4H-SiC substrate of diameter 75 mm and thickness 400 µm on which an oxide film of 200 nm had been grown was furnished. Hydrogen ions were implanted into the substrate at 75 KeV and in a dose of $2 \times 10^{17}$ atoms/cm$^2$.

A sapphire substrate of diameter 75 mm and thickness 400 µm was furnished as the base substrate. The ion-implanted surface of the silicon carbide substrate and a surface of the sapphire substrate were treated with ozone, after which the substrates were bonded together.

Next, the mated substrates were heat treated at 150° C. for 5 hours to form a bonded substrate.

Next, the bonded substrate was set in a boat, and heated at 700° C. in a diffusion furnace, yielding a hybrid substrate in which a silicon carbide film was uniformly transferred to the sapphire substrate surface. Notably, the silicon carbide substrate after the transfer was then polished 10 µm at the surface, and cleaned to remove any stains like slurry after polishing whereupon it was ready for reuse as the bonding substrate.

The silicon carbide thin film of the resulting hybrid substrate was mirror polished at the surface by CMP polishing using a selected slurry and pad to a polishing thickness of 0.2 µm, and then heat treated in vacuum at 1,280° C. for 10 hours, yielding a nanocarbon film.

Thereafter, the film on the sapphire substrate was analyzed by Raman spectroscopy, confirming a graphene film formed on the surface.

Comparative Example 1

A silicon carbide substrate in the form of a 4H-SiC substrate of diameter 75 mm and thickness 400 µm was furnished. The substrate was heated in vacuum for sublimation of silicon atoms, forming a graphene film on the surface. An attempt to separate and transfer the graphene film to another substrate failed.

Comparative Example 2

A substrate was furnished by epitaxially growing silicon carbide on a silicon carbide substrate in the form of a 4H-SiC substrate of diameter 75 mm and thickness 400 μm. Heat treatment in vacuum was carried out for sublimation of silicon atoms. A graphene film formed on the substrate surface. On analysis by Raman spectroscopy, many defects were observed.

Although the invention has been described with reference to the embodiments, the invention is not limited thereto. Other embodiments, changes, modifications and omissions may be made as long as such occurs to those skilled in the art. All such embodiments are included in the scope of the invention as long as the desired effects and results are available.

REFERENCE SIGNS LIST 1, 1a silicon carbide substrate
2 ion-implanted region
3 base substrate
4 bonded substrate
5 silicon carbide thin film
6, 6' hybrid substrate
7 nanocarbon film

The invention claimed is:

1. A method for producing a nanocarbon film using a hybrid substrate, comprising the steps of:
implanting ions into a surface of a single crystal silicon carbide substrate to form an ion-implanted region,
bonding the ion-implanted surface of the silicon carbide substrate to a surface of a base substrate,
separating the silicon carbide substrate at the ion-implanted region, thus leaving a hybrid substrate having a single crystal silicon carbide-containing thin film transferred onto the base substrate, and
then heating the hybrid substrate so that silicon atoms may sublime from the single crystal silicon carbide-containing thin film, yielding a nanocarbon film.

2. The method for producing a nanocarbon film of claim 1 wherein said base substrate comprises single crystal silicon, sapphire, polycrystalline silicon, alumina, silicon nitride, aluminum nitride or diamond.

3. The method for producing a nanocarbon film of claim 1 wherein a film is formed on at least the surface of the silicon carbide substrate and/or the base substrate to be bonded, the film comprising at least one component selected from the group consisting of silicon oxide, single crystal silicon, polycrystalline silicon, amorphous silicon, alumina, silicon nitride, silicon carbide, aluminum nitride, and diamond.

4. The method for producing a nanocarbon film of claim 1 wherein the silicon carbide substrate has a crystal structure of 4H-SiC, 6H-SiC or 3C-SiC.

5. The method for producing a nanocarbon film of claim 1 wherein the step of forming an ion-implanted region includes implanting ions containing at least hydrogen ions into a surface of the silicon carbide substrate.

6. The method for producing a nanocarbon film of claim 1 wherein the surface of the silicon carbide substrate and/or the base substrate to be bonded is subjected to at least one surface activation treatment selected from the group consisting of ion beam treatment, plasma activation treatment, ozone treatment, acid washing treatment and alkali washing treatment, prior to the bonding step.

7. The method for producing a nanocarbon film of claim 1 wherein after the step of bonding the silicon carbide substrate to the base substrate, the step of separating the silicon carbide substrate at the ion-implanted region includes providing thermal energy, mechanical energy or light energy to the ion-implanted region.

8. The method for producing a nanocarbon film of claim 1 wherein the step of bonding the silicon carbide substrate to the base substrate includes heat treatment at 150° C. or higher.

9. The method for producing a nanocarbon film of claim 1 wherein the hybrid substrate is heated at 1,100° C. or higher for sublimation of silicon atoms.

10. The method for producing a nanocarbon film of claim 1 wherein the hybrid substrate is heated in vacuum for sublimation of silicon atoms.

11. The method for producing a nanocarbon film of claim 1 wherein the nanocarbon film comprises carbon nanotubes, graphene or fullerene.

12. The method for producing a nanocarbon film of claim 1 wherein after the separation step, the silicon carbide substrate is used again for the production of nanocarbon film.

13. A nanocarbon film produced by the method of claim 1.

* * * * *